US009842947B2

United States Patent
Martorell Pena et al.

(10) Patent No.: US 9,842,947 B2
(45) Date of Patent: Dec. 12, 2017

(54) PHOTOCONVERSION DEVICE WITH ENHANCED PHOTON ABSORPTION

(75) Inventors: Jordi Martorell Pena, Barcelona (ES); Rafael Andrés Betancur Lopera, Barcelona (ES); Pablo Romero Gómez, Barcelona (ES); Luat Vuong, Barcelona (ES)

(73) Assignees: FUNDACIO INSTITUT DE CIENCIES FOTONIQUES, Barcelona (ES); UNIVERSITAT POLITECNICA DE CATALUNYA, Barcelona (ES)

( * ) Notice: Subject to any disclaimer, the term of this patent is extended or adjusted under 35 U.S.C. 154(b) by 0 days.

(21) Appl. No.: 13/358,687

(22) Filed: Jan. 26, 2012

(65) Prior Publication Data

US 2013/0192666 A1     Aug. 1, 2013

(51) Int. Cl.
*H01L 31/00*        (2006.01)
*H01L 31/0216*      (2014.01)
*H01L 31/054*       (2014.01)

(52) U.S. Cl.
CPC .... *H01L 31/02168* (2013.01); *H01L 31/0547* (2014.12); *Y02E 10/52* (2013.01)

(58) Field of Classification Search
CPC ......... H01L 31/02246; H01L 31/02168; H01L 31/0547; H01L 31/0352; H01L 31/0232; Y02E 10/52
USPC ......................................................... 136/255
See application file for complete search history.

(56) References Cited

U.S. PATENT DOCUMENTS

| | | | | |
|---|---|---|---|---|
| 4,126,150 A | * | 11/1978 | Bell et al. ....................... | 136/255 |
| 4,271,328 A | * | 6/1981 | Hamakawa ........... | H01L 31/076 |
| | | | | 136/249 |
| 4,442,185 A | * | 4/1984 | Skotheim ............ | H01M 14/005 |
| | | | | 429/111 |
| 4,442,310 A | | 4/1984 | Carlson | |
| 4,609,771 A | * | 9/1986 | Guha et al. ................... | 136/249 |
| 4,795,500 A | * | 1/1989 | Kishi et al. ................... | 136/244 |
| 5,828,117 A | * | 10/1998 | Kondo et al. ................. | 257/458 |
| 2008/0190479 A1 | * | 8/2008 | Hsieh .................. | H01L 25/0756 |
| | | | | 136/246 |
| 2008/0216885 A1 | * | 9/2008 | Frolov ................ | H01L 31/0725 |
| | | | | 136/244 |
| 2009/0025791 A1 | * | 1/2009 | Matsui .......................... | 136/261 |

(Continued)

FOREIGN PATENT DOCUMENTS

WO     2008112639 A2     9/2008

OTHER PUBLICATIONS

Richard Lunt, "Transparent, near-infrared organic photovoltaic solar cells for window and energy-scavenging applications" Applied Physics Letters 98, 113305 (2011).

(Continued)

*Primary Examiner* — Uyen Tran
(74) *Attorney, Agent, or Firm* — Cantor Colburn LLP

(57) ABSTRACT

A photovoltaic device cell comprising a first light transmissive electrical contact, an active region, a second light transmissive electrical contact, and a layered structure enclosing the active region, the layered structure being formed of two parts, a first part underlying the first light transmissive electrical contact and a second part overlying the second electrical contact and wherein the constants of the layers in these layered structures are interdependent such that light is localized within the active region.

12 Claims, 2 Drawing Sheets

(56) References Cited

U.S. PATENT DOCUMENTS

| | | | |
|---|---|---|---|
| 2009/0032098 A1* | 2/2009 | Lu | C03C 17/3417 136/257 |
| 2009/0140801 A1 | 6/2009 | Ozyilmaz et al. | |
| 2009/0194161 A1* | 8/2009 | Ji et al. | 136/256 |
| 2009/0211633 A1* | 8/2009 | Schilinsky et al. | 136/256 |
| 2011/0030792 A1 | 2/2011 | Miguez | |

OTHER PUBLICATIONS

J. Meier, "Potential of amorphous and microcrystalline silicon solar cells", Thin Solid Films 451-452 (2004) 518-524.

Ruud E. I. Schropp, "Amorphous and Microcrystalline Silicon Solar Cells", Modeling, Materials and Device Technology, Book, p. 160-162.

Myung-Ho Bae et al. "Scaling of High-Field Transport and Localized Heating in Graphene Transistors" ACS NANO, American Chemical Society, Sep. 13, 2011, pp. 7936-7944, vol. 5, No. 10, XP055089197 www.acsnano.org.

Stephane Berciaud et al. "Electron and Optical Phonon Temperatures in Electrically Biased Graphene", Physical Review Letters, The American Physical Society, Jun. 3, 2010, pp. 227401-1-227401-4, vol. 104, No. 22, XP055089204.

Nathaniel M. Gabor et al. "HotCarrier-Assisted Intrinsic Photoresponse in Graphene", Science, Oct. 6, 2011, pp. 648-652, vol. 334, No. 6056, www.sciencemag.org, XP055089620.

International Search Report issued Dec. 2, 2013; re: PCT/EP2013/051532; citing: WO 2008/112639 A2, Ryzhii et al. "Device Model for Graphene . . . ", Ju et al. "Graphene Plasmonics . . . ", US 2009/140801 A1, Tian et al. "Ambipolar graphene . . . ", Bae et al. "Scaling of High-Field . . . ", Berciaud et al. "Electron and Optical . . . ", Liao et al. "Thermally Limited . . . ", Gabor et al. "Hot Carrier-Assisted . . . ", Thongrattanasiri et al. "Complete Optical Absorption . . . ", Koppens et al. "Graphene Plasmonics . . . ", and Song et al. "Hot Carrier Transport . . . ".

Long Ju et al. "Graphene plasmonics for tunable terahertz metamaterials", Nature Nanotechnology, Sep. 4, 2011, pp. 630-634, vol. 6, No. 10, XP055019212.

Frank H. L. Koppens et al. "Graphene Plasmonics: A Platform for Strong Light-Matter Interactions", Nano Letters, ACS Publications Amercian Chemical Society, Jul. 18, 2011, pp. 3370-3377, vol. 11, No. 8, XP055074440.

Albert D. Liao et al. "Thermally Limited Current Carrying Ability of Graphene Nanoribbons", Physical Review Letters, American Physical Society, Jun. 20, 2011, pp. 256801-1-256801-4, vol. 106, Nol. 25, XP055089212.

Victor Ryzhii et al. "Device Model for Graphene Nanoribbon Phototransistor", Applied Physics Express, The Japan Society of Applied Physics, Jun. 6, 2008, 063002-1-063002-2, vol. 1, No. 6, XP001516309.

Justin C.W. Song et al. "Hot Carrier Transport and Photocurrent Response in Graphene", Nano Letters, ACS Publications, American Chemical Society, Sep. 21, 2011, pp. 4688-4692, vol. 11, No. 11, XP055089626.

Sukosin Thongrattanasiri et al. "Complete Optical Absorption in Periodically Patterned Graphene", Physical Review Letters, American Physical Society, Jan. 27, 2012, pp. 047401-1-047401-5, vol. 108, No. 4, XP055088171.

J. F. Tian et al. "Ambipolar graphene field effect transistors by local metal side gates", Applied Physics Letters, American Institute of Physics, Jul. 1, 2010, pp. 263110-1-236110-3, vol. 96, No. 26, Melville, NY US, XP012131771.

* cited by examiner

PHOTOCONVERSION DEVICE WITH ENHANCED PHOTON ABSORPTION

TECHNICAL FIELD

The present invention relates to photoconversion devices such as photovoltaic cells or photodetectors. More in particular, the invention is related to a light transmissive layered structure to achieve light localization in the active region of a photovoltaic device.

BACKGROUND OF INVENTION

Light localization has been used effectively to enhance the performance of many devices that rely on an efficient interaction between light and matter. Light localization refers to an increase of the light intensity in a local region on the axis or longitudinal direction of the light propagation. Light localization can be achieved using Fabry-Perot type cavities, periodic gratings, photonic crystals, micro-resonators, periodic or non-periodic distribution of layers that alternate high and low index of refraction materials, and many other distributions of dielectric or metallic materials. In photovoltaic devices, photons (light) absorbed by the photovoltaic active material are converted to electron-hole pairs or charged carriers. An effective absorption of the light by such photovoltaic material can be achieved when the thickness of such layer is longer than the material photon absorption length in a broad range of the solar spectrum. This length varies from one photovoltaic material to another but, an effective absorption of photons in a broad range of the solar spectrum may require the use of 10 s or 100 s of microns of active material. Several drawbacks are linked to the use of such thick material layers as, an increase in material cost, an increase in electron-hole recombination due to the finite carrier drift or diffusion length, or a reduction in transparency for cells meant to be used as windows, for instance, in Building integrated photovoltaics (BIPV). Several techniques to increase light absorption in thin-film devices and methods of manufacturing the same have been disclosed in patents and journal publications.

U.S. Pat. No. 4,126,150 sets forth a transparent layer which thickness is adjusted to increase the solar radiation absorption efficiency.

J. Meier at al./Thin Solid Films 451-452 (2004) 518-524 report on the use of an anti-reflection multilayer design in order to couple more light inside an amorphous silicon p-i-n cell.

U.S. Pat. No. 4,442,310 discloses a spacer layer in between the back metal contact and the body of the active material to reduce the reflectivity of the photovoltaic cell in a particular wavelength range. A similar approached applied to dye sensitized solar cells and using a one-dimensional photonic crystal to achieve reflection was disclosed in US 2011/0030792 A1.

R. R. Lunt et al./Applied Physics Letters 98 (2011) Art. No. 113305 report on the use of distributed Bragg reflector mirror to increase reflectivity in the infrared which subsequently increases the efficiency of a low efficiency transparent organic solar cell.

In amorphous silicon cells, typically, an increase in the absorption light trapping is achieved by introducing a textured substrate and special back reflectors. This leads to a large suppression of losses due to optical reflection outside the cell or to light transmission to the back contact as described by Ruud E. I. Schropp and M. Zeman in "Amorphous and Microcrystalline Silicon Solar Cells," published by Kluwer Academic Publishers (1998) p. 160-162. However, textured substrates or textured layers are a source of diffusion which in a transparent cell to be used for instance, in automobile windshields or in architectural installations would lead to a loss of clear vision.

SUMMARY OF THE INVENTION

The main object of the present invention is to increase absorption in a photodetector or photovoltaic cell. This effect is achieved by using an optical layered structure to achieve light localization in the photovoltaic active region of the device. Light localization as opposed to conventional light trapping offers the possibility to increase absorption without light diffusion or scattering. The photodetector or photovoltaic cell comprises a first light transmissive electrical contact underlying one surface of the active photosensitive region, a photosensitive region, a light transmissive electrical contact overlying the opposite surface of the photosensitive region, and a light transmissive layered structure separated in two layered parts, one part underlying the first electrical contact and a second part overlying the second electrical contact.

BRIEF DESCRIPTION OF THE FIGURES

To complete the description and in order to provide for a better understanding of the invention, a set of drawings is provided.

DETAILED DESCRIPTION OF THE INVENTION

Figure 1:
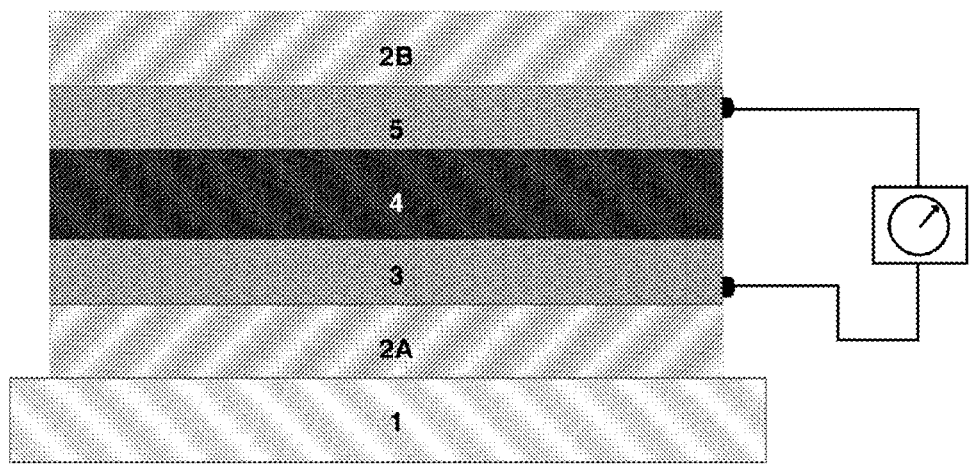
FIG. 1 is the cross-sectional representation of the photovoltaic device of the present invention.

The present invention integrates a photodetector or photovoltaic cell in a structure of light transmissive parts 2 that can be comprised of sub-layers, where the index of refraction of a given sub-layer is different than the index of refraction of the adjacent layer. It is understood that sub-layers become indistinguishable when the index of refraction is the same at all wavelengths. The thickness of each part (2A, 2B) is determined to effectively localize light (photons) in the active region of the device depending on the number of sub-layers. Such a design allows to achieve light localization in a broad wavelength range within the absorption band of the active region 4. By active region 4 is meant the portion of the device in which light (or photons) can be absorbed to generate carriers. The light transmissive layered structure comprises at least two parts, one part 2A underlying and in contact the first light transmissive electrode 3, which is underlying the active region 4, and a second part 2B overlying and in contact with the second transmissive electrode 5 which is overlying the active region 4. However, the layered structure acts as a single element with one purpose, i.e. localizing light. To localize light effectively the constants of both parts must be interdependent.

In one embodiment, the invention comprises a photodetector or photovoltaic device comprising a light transmissive substrate 1, a first part 2A of the light transmissive layered structure 2 overlying the substrate 1, a light transmissive first electrical contact 3 overlying the first part of the layered structure 2A, an active region 4 overlying the first part of the layered structure, a second light transmissive electrical contact 5 overlying the active region 4, and the second part 2B of the light transmissive layered structure 2 overlying the second light transmissive electrical contact 5.

The photovoltaic active region 4 is described as an amorphous silicon PIN junction solar cell. The thickness of the active region 4 ranges from 20 to 100 nanometers. It is evident to those skilled in the art that the photovoltaic active region could be of other similar material configurations, e.g. microcrystalline silicon or amorphous silicon and germanium. It is also evident to those skill in the art that the photovoltaic active region 4 could be of other material configurations such as a two-junction semiconductor cell, a triple-junction semiconductor cell, or a tandem semiconductor with a three terminal structure cell. The latter structures may contain additional light transmissive electrical contacts interlayered in the active region.

In FIG. 1 the active region 4 comprises an intrinsic type conductivity region of amorphous silicon having a good optical absorption and regions of opposite conductivity type forming a p-i-n type semiconductor. The first part 2A of the layered structure comprises at least one or many sub-layers of light transmissive materials as dielectric materials or thin metals. It is understood that what differentiates a sub-layer from another sub-layer of the layered structure in the present invention is the index of refraction. It is also understood that two sub-layers become indistinguishable when the index of refraction is the same at all wavelengths. The index of the first sub-layer of such first part 2A of the layered structure overlying the substrate material 1 must have an index of refraction different than the index of the second sub-layer overlying the first. The second sub-layer overlying the first must have an index of refraction different than the first sub-layer underlying the second and the third sub-layer overlying the second sub-layer. This sequencing is repeated up to the last sub-layer underlying the first transmissive electrical contact 3. The second part 2B of the layered structure comprises at least one or many sub-layers of light transmissive materials as dielectric materials or thin metals. The index of the first sub-layer of such second layered structure overlying the second electrical contact 5 must have an index of refraction different than the one of the second sub-layer overlying the first. The second sub-layer overlying the first must have an index of refraction different than the first sub-layer underlying such second sub-layer and the third sub-layer overlying such second sub-layer. This sequencing is repeated up to the last sub-layer. The total number of sub-layers, material and thickness of each sub-layer are chosen to maximize the performance of photovoltaic device. The thickness of each sub-layer may range from one atom thick layer to 200 nm. The exact selection of material and thickness for each sub-layer depends on the constants of the of rest of sub-layers and the constants of the other layers of the device 3,4, and 5. Maximize the performance of the device must be understood as to achieve an optimal light localization that maximizes the efficiency of light to electricity conversion, minimizes the fabrication cost of the device, and optimizes other useful properties of the photovoltaic device as the light transmission in the visible region, filtering in the UV or Infrared, or the color hue of the vision obtained by the human eye through the device. An optimal light localization must be understood as limited to the spectral region of maximum sun light absorption by amorphous silicon, the active material 4. Such spectral region comprises the visible and near infra-red portions of the light spectrum which wavelength ranges from 400 to 800 nanometers.

The substrate 1 of the invention can be of any light transmissive rigid or flexible material on which the photovoltaic cell can be grown upon as glass, crystal, transparent metal, semiconductor, plastic. Examples of these materials are silica ($SiO_2$), borosilicate (BK7) and PET.

The first and second transmissive electrical contacts (3 and 5) may comprise a thin metal layer from the elements of the group of Ag, Al, Au, Ti, Ni, Cu, . . . or combinations thereof, or a transparent conductive oxide layer from the group of ITO, ZnO, Al:ZnO, $SnO_2$, FTO, or conductive polymers such as PEDOT, PEDOT:PSS, PEDOT-TMA or a carbon nanotube, or a graphene layer. Each sub-layer of the layered structure 2 may comprise a transparent inorganic material such as $TiO_2$, $SiO_2$, $SiN1.3{:}H$, $SiO_2{:}F$, $Ta_2O_5$, ZnO, $Al_2O_3$, ZnS, $MgF_2$, $CaF_2$, . . . or mixtures of them. Alternatively the sub-layers may comprise polymer materials such as PMMA, Polystyrene, PET, . . . or mixtures of polymers and inorganic materials, polymers and thin metals, or inorganic materials and thin metals.

BEST MODE

Figure 2:
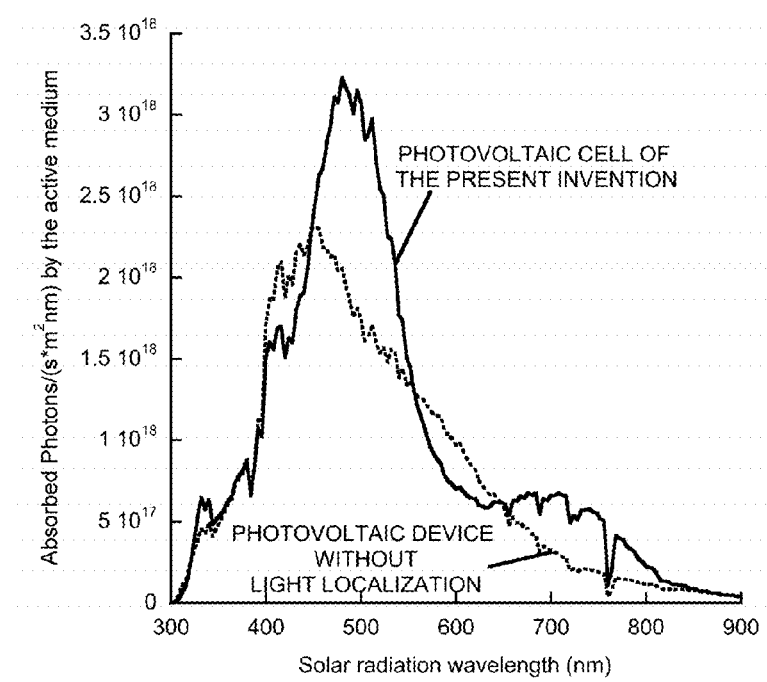
FIG. 2 is a graph comparing the absorbed photons, which is proportional to the photo-carrier generation efficiency, for the photovoltaic cell of the present invention when the active material is amorphous silicon to a cell with no light localization with the same thickness of amorphous silicon as active material.

Referring to FIG. 2 a comparison is shown of the absorbed number of photons which is directly proportional to the photo-carrier generation efficiency of the solar cell of the present invention to the absorbed number of photons of a similar solar cell, which does not include the layered structure 2 for light localization. The solid line in FIG. 2 represents the absorbed number of photons under AM1.5 illumination of 1 sun as a function of the wavelength of the incident light for the cell of the present invention. The dashed line represents the photo-carrier generation efficiency under the same illumination conditions as a function of the wavelength of the incident light for the comparison cell.

Figure 3:
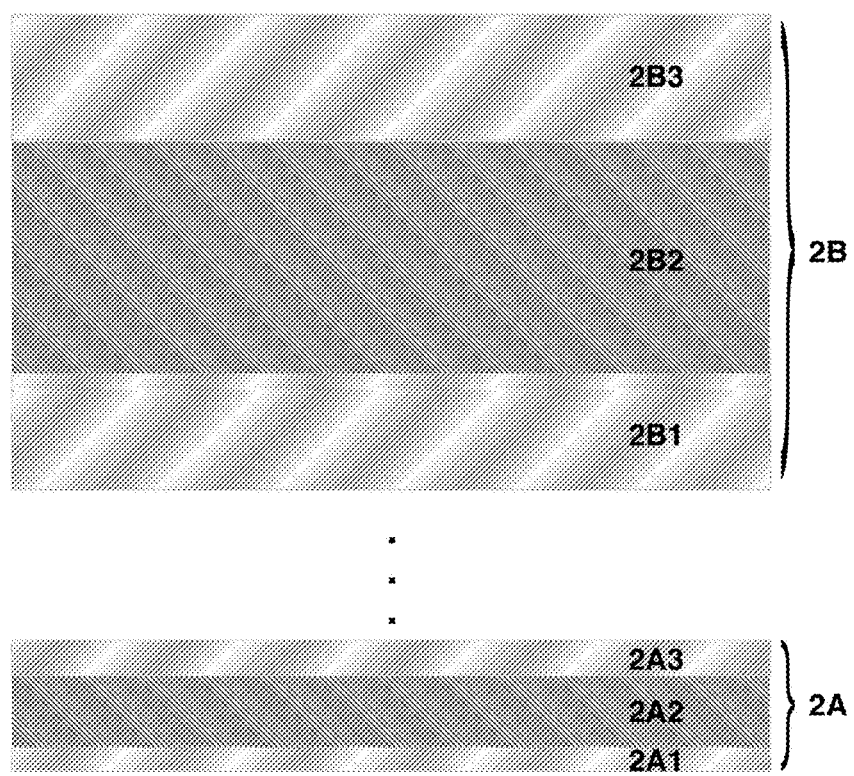
FIG. 3 is the cross-sectional representation of the best mode layered structure for light localization.

The absorbed number of photons of both cells is computed numerically. The body of the cell of the present invention comprises a silica glass substrate. A 260 nm thick AZO electrode underlying an 40 nm p-i-n amorphous silicon diode, a 90 nm ITO electrode overlying the p-i-n diode, and a six sub-layer structure separated into two parts. Referring to FIG. 3, the first part 2A is composed of a 10 nm sub-layer 2A1 of $TiO_2$, overlying the substrate and underlying a 32.5 nm $SiO_2$ sub-layer 2A2, underlying a second 15 nm $TiO_2$ sub-layer 2A3, which is underlying the AZO electrode. The second part 2B is composed of a 50 nm $TiO_2$ sub-layer 2B1 overlying the ITO electrode, a 97.5 nm $SiO_2$ sub-layer 2B2 overlying the first $TiO_2$ sub-layer 2B1 of that second part and underlying the last 50 nm $TiO_2$ sub-layer 2B3 which is the last layer that also isolates the rest of the device from air. The body of the comparison cell is the same except that it does not include the layered structure 2 for light localization.

In this text, the term "comprises" and its derivations (such as "comprising", etc.) should not be understood in an excluding sense, that is, these terms should not be interpreted as excluding the possibility that what is described and defined may include further elements. On the other hand, the invention is obviously not limited to the specific embodiment(s) described herein, but also encompasses any variations that may be considered by any person skilled in the art (for example, as regards the choice of materials, dimensions, components, configuration, etc.), within the spirit of the invention.

The invention claimed is:

1. A photovoltaic device comprising:
a first light transmissive electrical contact structured to connect the photovoltaic device to an external circuit;
an active region with a thickness between 20 and 100 nm;
a second light transmissive electrical contact structured to connect the photovoltaic device to the external circuit, wherein the first light transmissive electrical contact and the second light transmissive electrical contact are each in direct contact with the active region; and
a light transmissive layered structure enclosing the active region, the light transmissive layered structure being formed of a first layered structure part and a second layered structure part, the first layered structure part underlying and directly in contact with the first light transmissive electrical contact, and the second layered structure part overlying and directly in contact with the second light transmissive electrical contact, wherein the first layered structure part and the second layered structure part act as a single element such that light is localized within the active region,
wherein the first layered structure part and the second layered structure part each comprises two or more sub-layers of different transparent materials, the transparent materials are independently selected from the group consisting of $TiO_2$, $SiO_2$, $SiN_{1.3}$:H, $SiO_2$:F, $Ta_2O_5$, ZnO, $Al_2O_3$, ZnS, $MgF_2$, PMMA, Polystyrene, PET, mixtures of polymers, inorganic materials, and thin metals, and each sub-layer is a continuous layer covering the entire surface area of the active region;
wherein the index of refraction of a first sub-layer of transparent material of both the first layered structure part and the second layered structure part is different from an adjacent sub-layer of transparent material;
wherein the first and the second light transmissive electrical contacts comprise a thin layer of a metal selected from the group consisting of Ag, Al, Au, Ti, Ni, Cu, and combinations thereof.

2. The photovoltaic device according to claim 1, wherein the thickness of each sub-layer ranges from one atom thick to 200 nm.

3. The photovoltaic device as in claim 1 wherein the active region is made of an amorphous silicon p-i-n type junction.

4. The photovoltaic device as in claim 1 wherein the active region is made of a microcrystalline silicon p-i-n type junction.

5. The photovoltaic device as in claim 1 wherein the active region is made of an amorphous silicon and germanium p-i-n type junction.

6. The photovoltaic device as in claim 1 wherein the active region is made of a two-junction semiconductor type cell.

7. The photovoltaic device as in claim 1 wherein the active region is made of a triple-junction semiconductor type cell.

8. The photovoltaic device as in claim 1 wherein the active region is made of tandem semiconductor type cell with a three terminal structure comprising additional light transmissive electrical contacts interlayered in the active region.

9. A The photovoltaic device as in claim 1 having a light transmissive substrate underlying the first layered structure part.

10. A photodetector comprising the photovoltaic device of claim 1.

11. The photovoltaic device according to claim 1, wherein the first layered structure part comprises a first sub-layer of $TiO_2$, a second sub-layer of $SiO_2$, and a third sub-layer of $TiO_2$.

12. The photovoltaic device according to claim 1, wherein the second layered structure part comprises a first sub-layer of $TiO_2$, a second sub-layer of $SiO_2$, and a third sub-layer of $TiO_2$.

* * * * *